United States Patent
Chong et al.

(10) Patent No.: US 10,483,343 B2
(45) Date of Patent: Nov. 19, 2019

(54) INDUCTORS FOR CHIP TO CHIP NEAR FIELD COMMUNICATION

(71) Applicants: Euhan Chong, Ottawa (CA); Davide Tonietto, Ottawa (CA); Zhonggui Xiang, Ottawa (CA)

(72) Inventors: Euhan Chong, Ottawa (CA); Davide Tonietto, Ottawa (CA); Zhonggui Xiang, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/625,731

(22) Filed: Jun. 16, 2017

(65) Prior Publication Data
US 2018/0366535 A1     Dec. 20, 2018

(51) Int. Cl.
*H01L 49/02* (2006.01)
*H01L 23/00* (2006.01)
*H04B 5/00* (2006.01)

(52) U.S. Cl.
CPC .............. *H01L 28/10* (2013.01); *H01L 24/05* (2013.01); *H04B 5/0012* (2013.01); *H04B 5/0075* (2013.01); *H01L 2224/023* (2013.01); *H01L 2224/05624* (2013.01)

(58) Field of Classification Search
CPC ............................ H01L 28/10; H04B 5/0075
See application file for complete search history.

(56) References Cited

U.S. PATENT DOCUMENTS

| | | | | |
|---|---|---|---|---|
| 5,479,695 A * | 1/1996 | Grader | ................ | H01F 17/0033 156/89.28 |
| 6,031,445 A * | 2/2000 | Marty | ................ | H01F 27/2804 257/E21.022 |
| 7,417,525 B2 * | 8/2008 | Lee | ................ | H01F 17/0033 257/E21.022 |
| 7,463,112 B1 * | 12/2008 | Groves | ................ | H03H 7/38 333/33 |
| 8,031,041 B2 * | 10/2011 | Sugahara | ................ | H02M 3/33569 336/200 |
| 2004/0119574 A1 * | 6/2004 | Lee | ................ | H01F 17/0013 336/200 |

(Continued)

FOREIGN PATENT DOCUMENTS

CN    103377809 A    10/2013
CN    106062903 A    10/2016

OTHER PUBLICATIONS

Definition of Telecoil (T-Coil), Harris Communications, at https://www.harriscomm.com/newsletter/tcoil_definition.html, accessed Mar. 21, 2018, 1 page.*

(Continued)

*Primary Examiner* — Victoria K. Hall

(57) ABSTRACT

A device includes a first inductor positioned on a first substrate. The first inductor has at least one turn in a plane that is perpendicular to a plane of the first substrate. The first inductor is positioned for near field coupling with a second inductor. The second inductor is positioned on a second substrate, with at least one turn that is in a plane perpendicular to a plane of the second substrate. The second inductor is substantially parallel to the first inductor. Such an arrangement may be used for near field coupling, including edge-to-edge coupling, between two integrated circuits.

16 Claims, 11 Drawing Sheets

(56) References Cited

U.S. PATENT DOCUMENTS

| | | | |
|---|---|---|---|
| 2005/0263847 A1* | 12/2005 | Anzai | H01L 23/3114 |
| | | | 257/531 |
| 2008/0136575 A1* | 6/2008 | Edo | H01F 27/2804 |
| | | | 336/200 |
| 2008/0303623 A1* | 12/2008 | Hsu | H01F 17/0006 |
| | | | 336/200 |
| 2009/0166849 A1* | 7/2009 | Jao | H01L 23/3128 |
| | | | 257/700 |
| 2011/0006443 A1* | 1/2011 | Noguchi | H01L 23/585 |
| | | | 257/786 |
| 2011/0272781 A1* | 11/2011 | Tada | H01L 23/645 |
| | | | 257/531 |
| 2015/0061813 A1 | 3/2015 | Kim et al. | |
| 2016/0358709 A1 | 12/2016 | Kim et al. | |
| 2016/0372246 A1 | 12/2016 | Otsubo et al. | |
| 2018/0204811 A1* | 7/2018 | Saito | H01L 21/822 |

OTHER PUBLICATIONS

So Hasegawa, et al., "A 1 Tb/s/mm2 Inductive-Coupling Side-by-Side Chip Link", European Solid-State Circuits Conference, ESSCIRC Conference 2016: 42nd., pp. 469-472.

Atsutake Kosuge, et al., "A 6Gb/s 6pJ/b 5mm-Distance Non-Contact Interface for Modular Smartphones Using Two-Fold Transmission-Line Coupler and EMC-Qualified Pulse Transceiver", 2015 IEEE International Solid-State Circuits Conference (ISSCC).

* cited by examiner

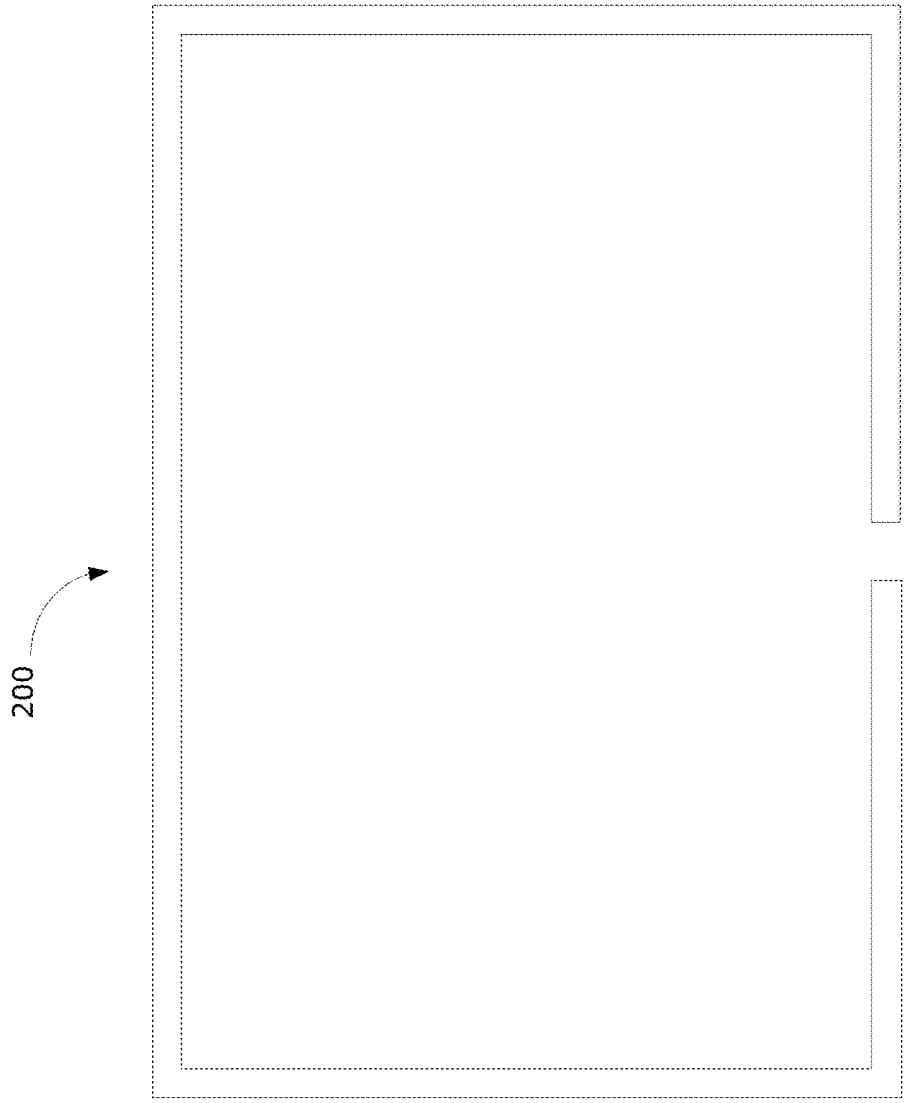

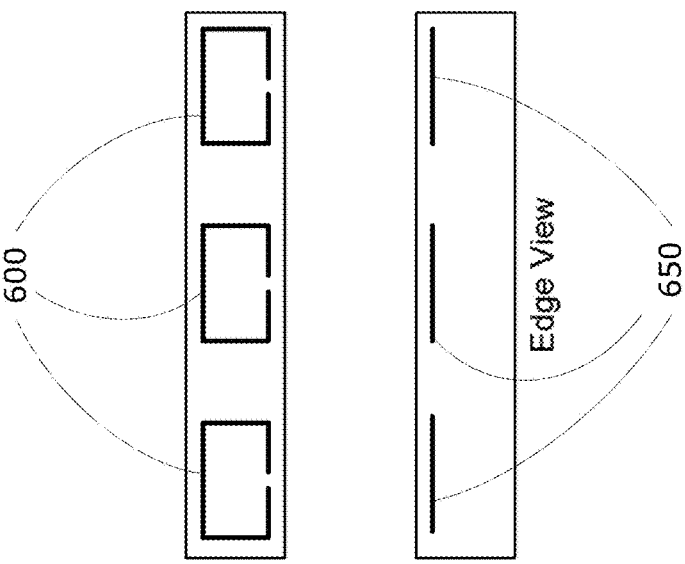
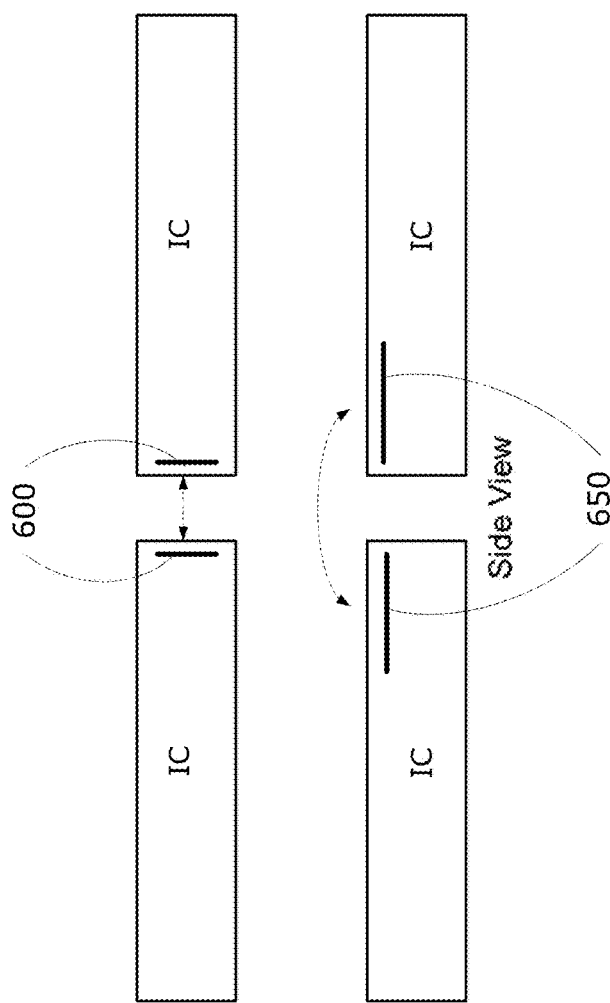
FIG. 6
(Prior Art)

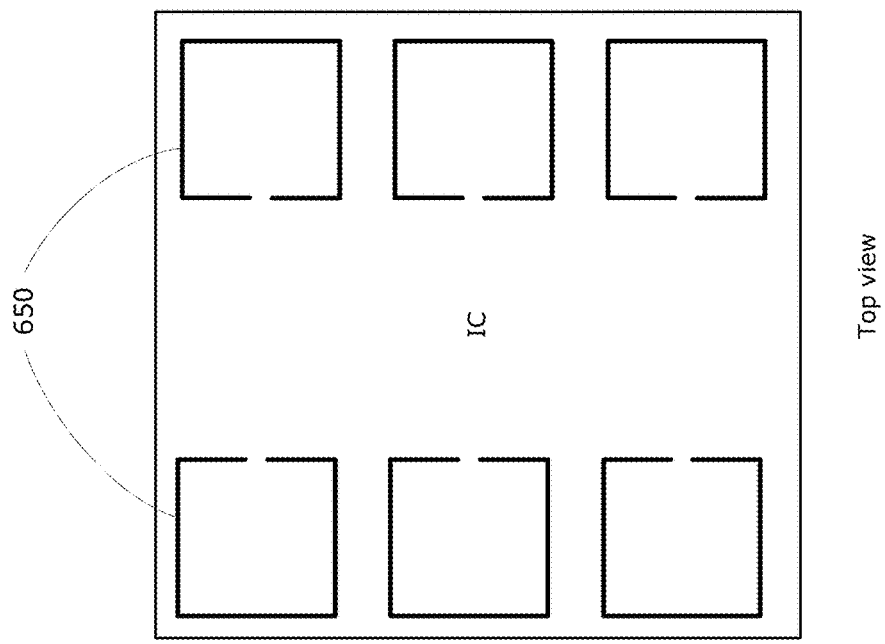
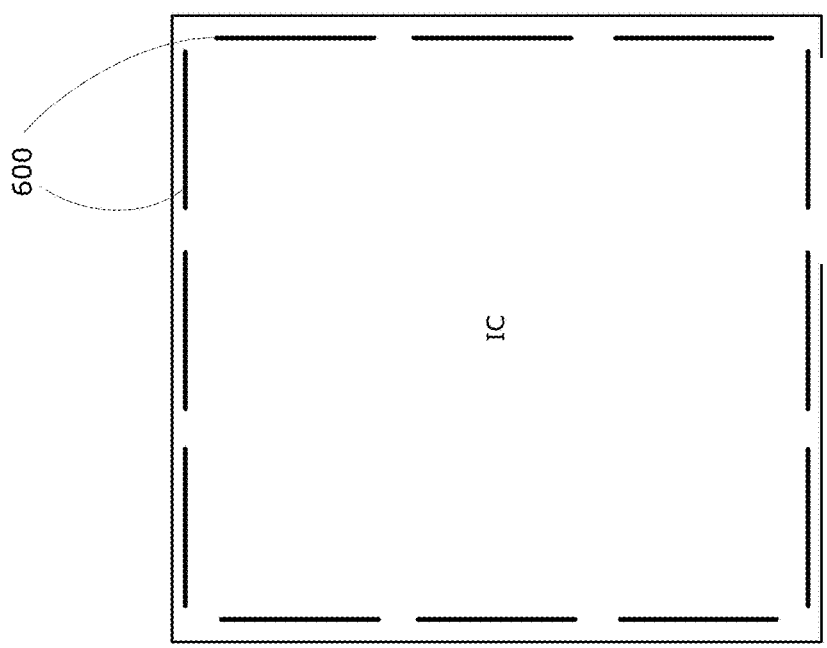
FIG. 7
(Prior Art)

INDUCTORS FOR CHIP TO CHIP NEAR FIELD COMMUNICATION

FIELD

The present disclosure relates generally to integrated circuit devices. In particular, the present disclosure relates to coils used for inductors and mutual coupling in integrated circuits, including use for Near Field Communication technology and in peaking inductors.

BACKGROUND

Near field communication or coupling is a technology used for System in Package (SiP) and three-dimensional chip integration. Three-dimensional integrated circuits (3D ICs) refer to integrated circuits manufactured by stacking silicon wafers and interconnecting them for greater density and power scaling. 3D ICs are currently used in various applications including 3D memory interfaces such as High Bandwidth Memory. Two-and-a-half-dimension (2.5D) integrated circuit is another example of SiP.

3D ICs may be mechanically interconnected using various techniques known in the art such as wire bonding, flip chip and through silicon vias (TSV). However, these techniques may be costly or suffer from reliability issues. In addition, these techniques may not be suitable for applications requiring high bandwidth.

Alternatively, two-dimensional (2D), 2.5D or 3D ICs may be interconnected using Near-Field Wireless Connection or Near Field Wireless Coupling (NFC) without mechanical interconnection. The chips may be coupled wirelessly via inductive couplers, capacitive couplers or transmission line couplers. In NFC, one or more inductors are placed on one or more chips. Magnetic flux is generated by a transmitting inductor. A receiving inductor on another chip converts the magnetic flux to electrical current. In inductive coupling, the chips may be stacked so that the inductors overlap from one chip to the other. Inductive coupling may also occur at the chip edge when chips are brought in close proximity as reducing distance between the inductors improves transmission efficiency. Such edge-to-edge coupling may be found in 2D or 2.5D ICs where two chips are placed side-by-side. Further, when the distance between inductors increases, the size of the inductors commensurately must be increased to compensate for the reduced coupling strength. Compared to mechanical connections, NFC may provide a cost, performance and reliability advantage. NFC techniques are less costly and may provide improved performance compared to other SiP IC integration methods, but conventional NFC techniques tend to suffer from reduced coupling efficiency.

Further, conventional inductors used for various applications including NFC and for bandwidth extension require large areas on a substrate or chip.

Additional difficulties with existing systems may be appreciated in view of the Detailed Description of Example Embodiments, below.

SUMMARY

Example vertical inductors described herein may be applicable to integrated inductors that are conventionally implemented in the horizontal plane of the integrated circuit.

Example vertical inductors described herein may enable reduction of area used by inductors generally and particularly in NFC SiP ICs and in peaking inductors. This may enable increased areas on a chip to be available for other components of the ICs. Further, the example vertical inductors described herein may reduce the distance between inductors, thus increasing magnetic coupling thereby improving coupling strength between transmitting and receiving inductors, which may result in improved efficiency.

In some aspects, the present disclosure provides a device including at least one inductor positioned on a substrate. The at least one inductor has at least one turn in a plane that is perpendicular to a plane of the substrate. The at least one inductor is positioned for near field coupling with another inductor.

According to an embodiment which can be combined with other embodiments disclosed herein, the present disclosure further describes a device wherein the at least one inductor is positioned at or near an edge of the substrate.

According to an embodiment which can be combined with other embodiments disclosed herein, the present disclosure further describes a device wherein at least one inductor is one of a series peaking inductor, a shunt peaking inductor, or a T-coil.

According to an embodiment which can be combined with other embodiments disclosed herein, the present disclosure further describes a device wherein the substrate includes an integrated circuit.

According to an embodiment which can be combined with other embodiments disclosed herein, the present disclosure further describes a device wherein the at least one inductor includes a first segment of a first metal layer of the integrated circuit and a second segment of a second metal layer of the integrated circuit. The first and second segments are electrically coupled through at least one via to form at least one turn of the at least one inductor.

According to an embodiment which can be combined with other embodiments disclosed herein, the present disclosure further describes a device wherein a top section of the at least one inductor is defined by a segment of an upper metal layer of the integrated circuit; wherein side sections of the at least one inductor is defined by one or more respective segments of one or more middle metal layers of the integrated circuit; and wherein a bottom section of the at least one inductor is defined by one or more respective segments of one or more lower metal layers of the integrated circuit. The respective segments are electrically coupled through vias to form at least one turn of the at least one inductor.

According to an embodiment which can be combined with other embodiments disclosed herein, the present disclosure further describes a device wherein the upper metal layer is a redistribution design layer (RDL) of the integrated circuit.

According to an embodiment which can be combined with other embodiments disclosed herein, the present disclosure further describes a device wherein the upper metal layer is an aluminum for bond pad (AP) layer of the integrated circuit.

According to an embodiment which can be combined with other embodiments disclosed herein, the present disclosure further describes a device wherein the at least one inductor comprises multiple turns.

According to an embodiment which can be combined with other embodiments disclosed herein, the present disclosure further describes a device wherein the substrate is an integrated circuit, wherein the at least one inductor comprises segments of a first metal layer of the integrated circuit and segments of a second metal layer of the integrated circuit, the segments being electrically coupled through vias, and wherein adjacent turns of the at least one inductor are connected using a multi-metal layer staircase pattern.

According to an embodiment which can be combined with other embodiments disclosed herein, the present disclosure further describes a device wherein the turns of the at least one inductor are similar to each other in dimensions.

In some aspects, the present disclosure describes a device including a first inductor positioned on a first substrate. The first inductor having at least one turn that is in a plane perpendicular to a plane of the first substrate. The device also includes a second inductor positioned on a second substrate. The second inductor has at least one turn that is in a plane perpendicular to a plane of the second substrate. The first and second substrates are substantially parallel to each other. The first and second inductors are designed to be inductively coupled to each other.

According to an embodiment which can be combined with other embodiments disclosed herein, the present disclosure further describes a device wherein at least one of the inductors is one of a series peaking inductor, a shunt peaking inductor, or a T-coil.

According to an embodiment which can be combined with other embodiments disclosed herein, the present disclosure further describes a device wherein the first substrate includes an integrated circuit.

According to an embodiment which can be combined with other embodiments disclosed herein, the present disclosure further describes a device wherein the first inductor includes a first segment of a first metal layer of the integrated circuit and a second segment of a second metal layer of the integrated circuit electrically. The first and second segments are coupled through at least one via to form at least one turn of the first inductor.

According to an embodiment which can be combined with other embodiments disclosed herein, the present disclosure further describes a device wherein a top section of the first inductor is defined by a segment of an upper metal layer of the integrated circuit; wherein side sections of the first inductor is are defined by one or more respective segments of one or more middle metal layers of the integrated circuit; and wherein a bottom section of the first inductor is defined by one or more respective segments of one or more lower metal layers of the integrated circuit. The respective segments are electrically coupled through vias to form at least one turn of the first inductor.

According to an embodiment which can be combined with other embodiments disclosed herein, the present disclosure further describes a device wherein the upper metal layer is a redistribution design layer (RDL) of the integrated circuit.

According to an embodiment which can be combined with other embodiments disclosed herein, the present disclosure further describes a device wherein the upper metal layer is an Aluminum for bond pad (AP) layer of the integrated circuit.

According to an embodiment which can be combined with other embodiments disclosed herein, the present disclosure further describes a device wherein the first and second substrates are positioned edge-to-edge.

According to an embodiment which can be combined with other embodiments disclosed herein, the present disclosure further describes a device wherein the first inductor includes multiple turns.

According to an embodiment which can be combined with other embodiments disclosed herein, the present disclosure further describes a device wherein the first substrate is an integrated circuit, wherein the first inductor comprises segments of a first metal layer of the integrated circuit and segments of a second metal layer of the integrated circuit, the segments being electrically coupled through vias, and wherein adjacent turns of the first inductor are connected using a multi-metal staircase pattern.

According to an embodiment which can be combined with other embodiments disclosed herein, the present disclosure further describes a device wherein the first and second inductors are used for near field communication in a system-in-package, a system-on-a-chip, a system-on-package or a multi-chip module.

BRIEF DESCRIPTION OF THE DRAWINGS

Reference will now be made, by way of example, to the accompanying drawings which show example embodiments of the present application, and in which:

FIG. 2 is a top diagrammatic view of an example horizontally-aligned prior art inductor;

FIG. 6 shows diagrammatic views of example semiconductors having an example coupling configuration using vertically-aligned inductors compared to a coupling configuration using horizontally-aligned inductors;

FIG. 7 shows top diagrammatic views of an example semiconductor having example vertically-aligned inductors compared to an example semiconductor having horizontally-aligned inductors;

Similar reference numerals may have been used in different figures to denote similar components.

DESCRIPTION OF EXAMPLE EMBODIMENTS

Figure 1A:
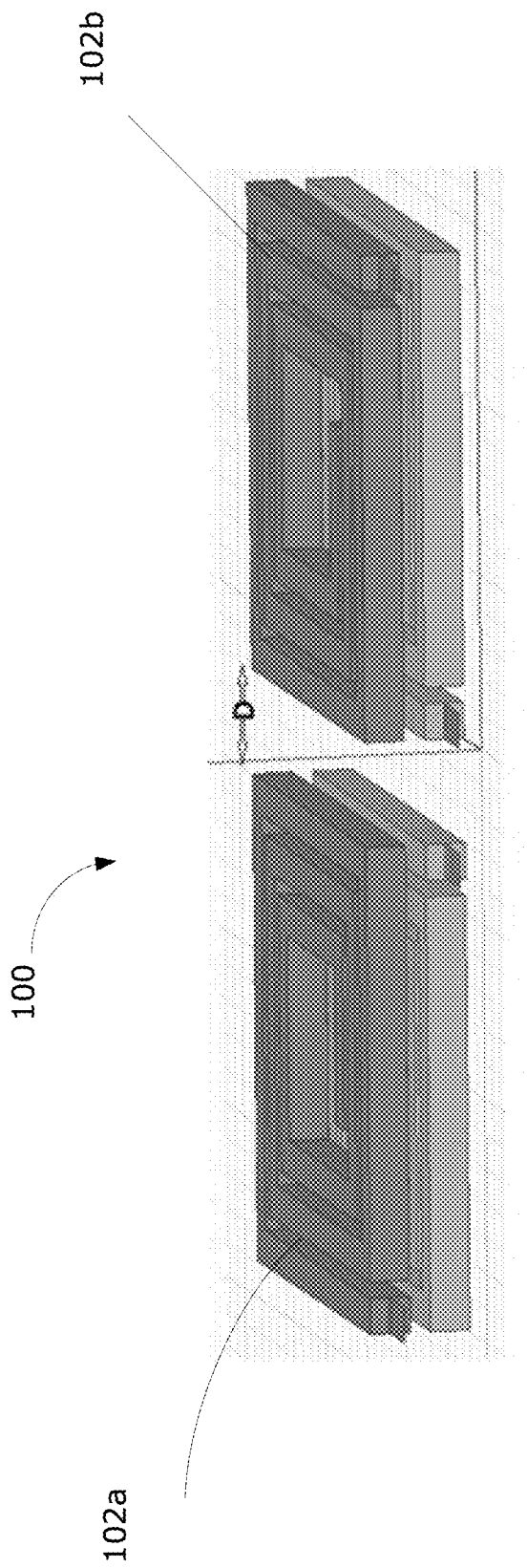
FIG. 1A is a perspective view of example horizontally-aligned prior art inductors.

FIG. 1A shows an example horizontally-aligned pair of inductively coupled inductors 100. The pair of inductors 100 includes inductors 102a and 102b (generally referred to as inductors 102). Inductors 102a, 102b may be provided on substrates (not shown) which may be one or two layers of an integrated circuit. Inductors 102 are formed with standard multi layer wiring and vias which create magnetic fields around the inductor. As shown in FIG. 1A, the inductors 102 are arranged side-by-side in a horizontal parallel configuration. In the present disclosure, the term "horizontal" is used to refer to the plane of the integrated circuit and the term "vertical" is used to refer to any plane perpendicular to the horizontal plane. A horizontally-aligned inductor 100 is therefore an inductor having turns that are substantially parallel to the plane of the integrated circuit and having a central axis (i.e., the axis about which the turns of the inductor 100 are made) substantially perpendicular to the plane of the integrated circuit.

In the example of FIG. 1A, when the horizontally-aligned inductors 102 are used for edge-to-edge coupling of two integrated circuits, inductive coupling is achieved only along one edge of each inductor 102a, 102b. Coupling strength between the inductors 102 may therefore be reduced to approximately ¼ of that of stacked inductors. Efficiency of transmission between edge-to-edge coupled integrated circuits is strongly dependent on the distance between inductors. In inductive coupling, minimizing coupling distance and increasing the coupling cross-sectional area is desirable for achieving power efficiency. Where the distance D between inductors 102 is between approximately ⅓ and ½ of the width or transverse dimension of the inductors 102, there may be high coupling strength and minimal cross talk from nearby sources of noise/interference. In practical implementation, the distance D may be greater than ⅓ to ½ of the width of the inductors 102.

Figure 1B:
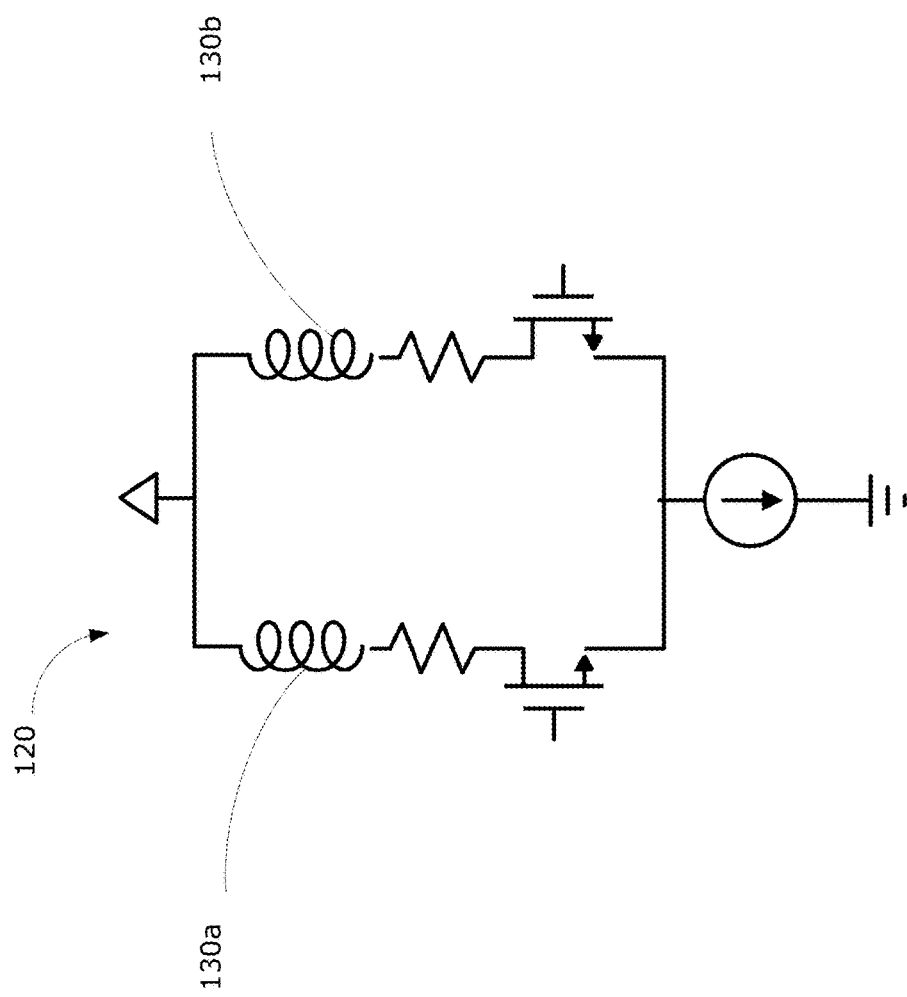
FIG. 1B is a perspective diagrammatic view of an example circuit using coupled inductors for bandwidth extension.

FIG. 1B shows an example conventional circuit 120. The circuit 120 includes inductors 130a, 130b which are inductively coupled. Such inductors may be used for bandwidth extension and may be referred to as peaking inductors. FIG. 1B shows an example peaking inductor operating with shunt peaking. Series peaking as well as T-coil inductors may also be used.

As shown in FIG. 1A, inductors tend to be implemented in the horizontal plane of the silicon substrate on which they are placed. In some examples, horizontally-aligned inductors consume a footprint on the order of ~150 µm×150 µm for NFC applications and 25 µm×25 µm for peaking inductors. Not only do the horizontally-aligned inductors consume the area on the metal layer in which they are placed, the field they generate results in the corresponding area above and below the inductors in other metal layers of the integrated circuit being blocked from being used.

In addition, horizontally-aligned NFC inductors are not as efficient in coupling from chip-edge to chip-edge, compared to when they are stacked above each other. This is because, when aligned edge-to-edge, only one side of each inductor is available for coupling, as shown in and described with reference to FIG. 1A above.

FIG. 2 is a top diagrammatic view of a single-turn horizontally-aligned inductor 200 (also referred to simply as a horizontal inductor), which may be horizontally positioned on a substrate, such as a layer of an integrated circuit (not shown). A horizontally-aligned inductor such as inductor 200 is typically implemented in one metal layer of the integrated circuit, typically the highest metal layer. The horizontally-aligned inductor 200 typically occupies a large footprint on the integrated circuit and prevents the same area in lower metal layers from being used.

Figure 3:
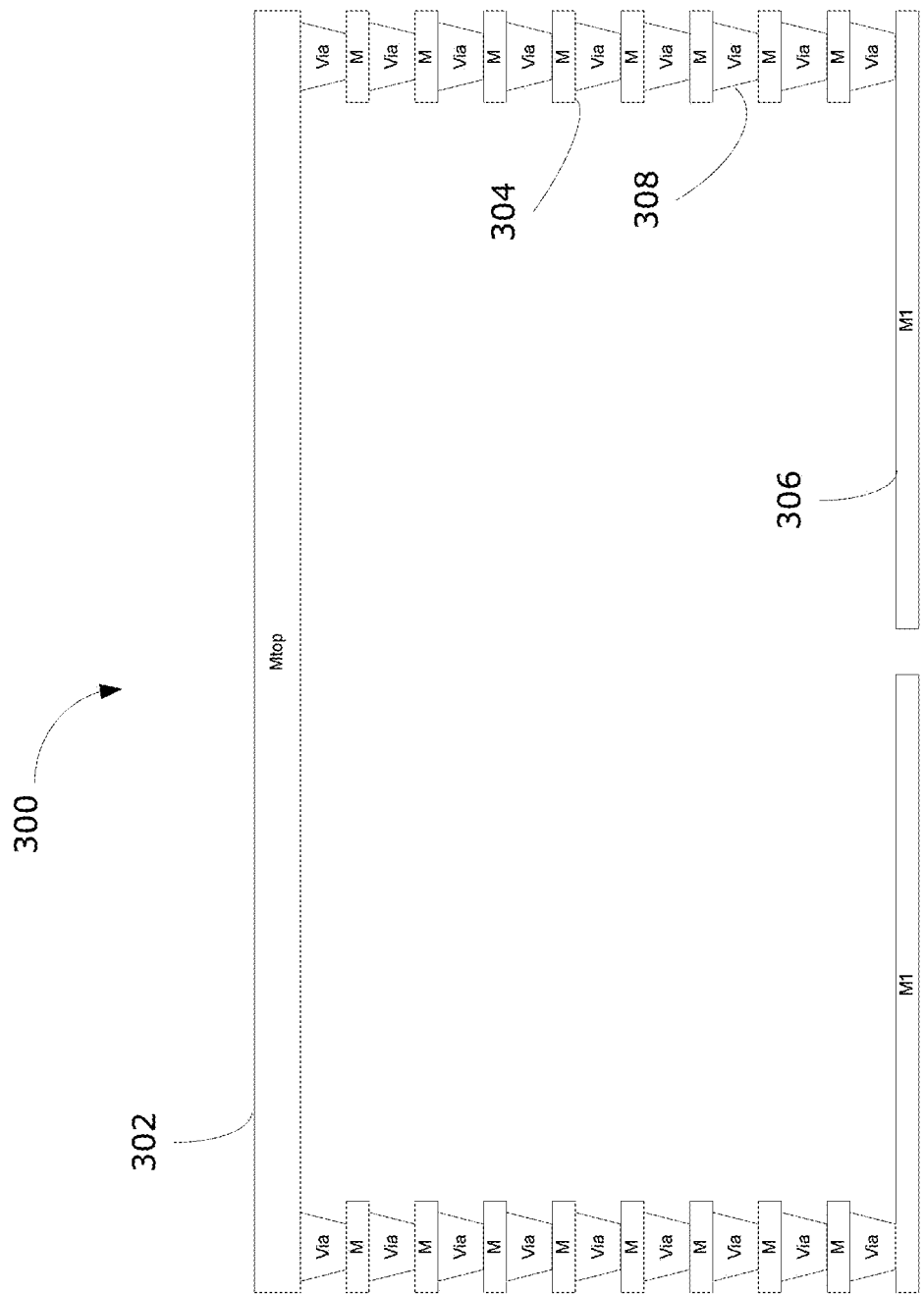
FIG. 3 is a side diagrammatic view of an example vertically-aligned inductor in accordance with an embodiment disclosed herein.

FIG. 3 is a side cross-sectional diagrammatic view of a single-turn vertically-aligned inductor 300 (also referred to simply as a vertical inductor). A vertically-aligned inductor 300 is an inductor having turns that are substantially perpendicular to the plane of the substrate (e.g., integrated circuit) and having a central axis substantially parallel to the plane of the substrate. In the various example inductors described herein, the substrate is an integrated circuit. However, other substrates may also be used.

The vertically-aligned inductor 300 is constructed at least partly by forming a conductive path through a plurality of metal layers, from a topmost layer 302 (which may be one of the upper metal layers of an integrated circuit), through subsequent metal layers 304 to one or more bottom layers 306 (which may be one or more of the lower metal layers of the integrated circuit), with the layers 302, 304, 306 connected through vias 308, as described in more detail below with reference to FIG. 4. Comparison of FIGS. 2 and 3 illustrate that a vertically-aligned inductor 300 may achieve similar inductor configuration and dimensions as a horizontally-aligned inductor 200, by using multiple metal layers of an integrated circuit rather than a single layer.

Figure 4:
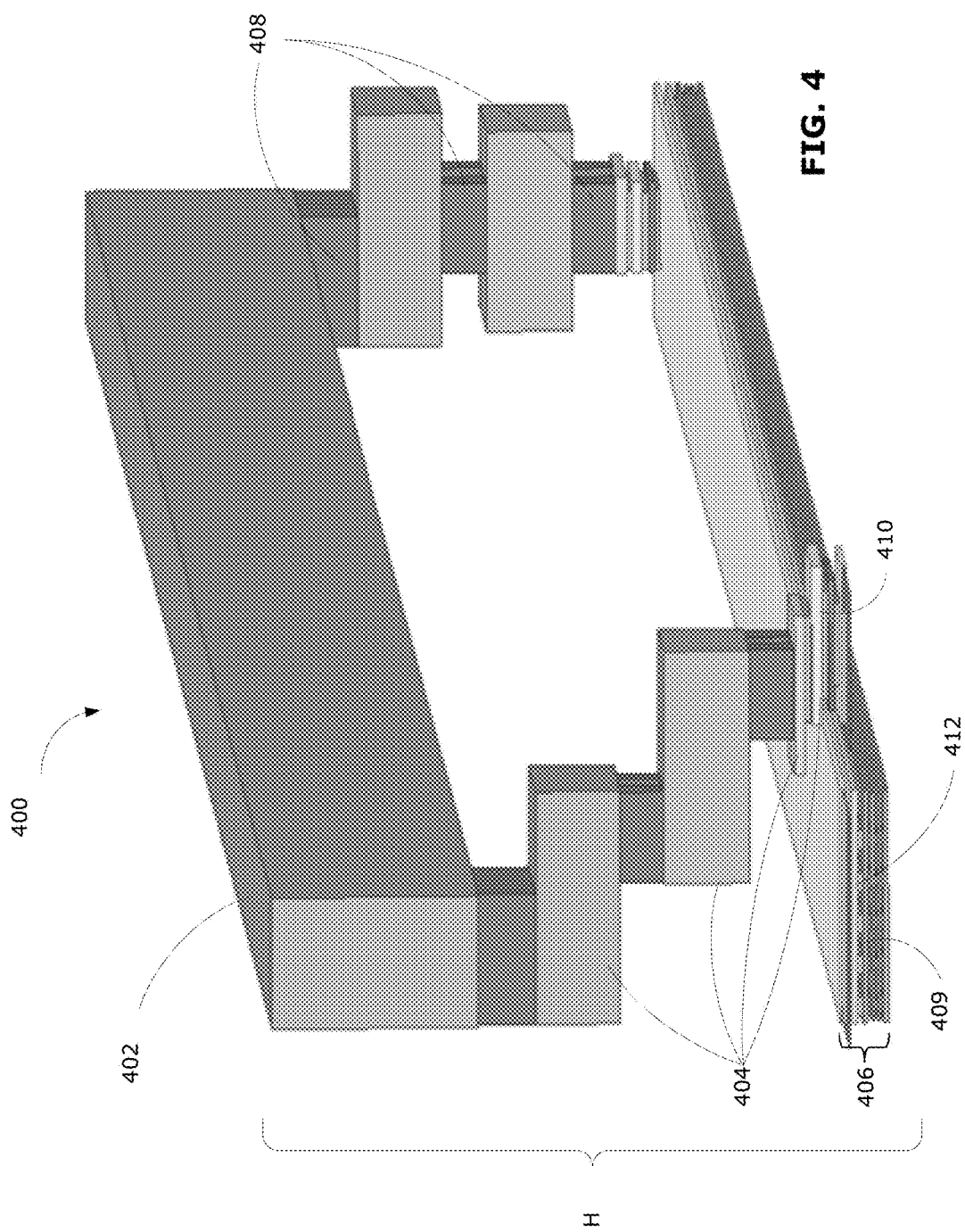
FIG. 4 is a perspective view of an example vertically-aligned inductor in accordance with an embodiment disclosed herein.

FIG. 4 is a perspective view of a 3D model for a single turn vertically-aligned inductor 400 according to an embodiment disclosed herein. The vertically-aligned inductor 400 includes a top section, side sections and a bottom section. The top section of the vertically-aligned inductor 400 in this example is formed by an upper metal layer segment 402 from an upper layer of an integrated circuit. The bottom section of the vertically-aligned inductor 400 in this example is formed by one or more lower metal layer segments 406 from one or more lower layers of the integrated circuit, where the one or more lower metal layer segments 406 are stacked together and electrically coupled together by vias 409. The side sections of the vertically-aligned inductor 400 are formed by one or more middle metal layer segments 404 from one or more middle layers of the integrated circuit, where the one or more middle metal layer segments are electrically coupled to each other and to the top and bottom sections by vias 408. On an integrated circuit, the metal layer segments 402, 404, 406 are layered on top of each other and electrically connected by a plurality of vias 408 to form at least one turn of the vertically-aligned inductor 400.

The selection of which metal layers and/or the number of metal layers of the integrated circuit to use to form the vertically-aligned inductor 400 may vary depending on the fabrication process, the application and/or manufacturing constraints. For example, the upper metal layer segment 402 may be from the M11 layer of an integrated circuit, the Aluminum for bond pad (AP) layer, or the Redistribution Layer (RDL). In the example shown in FIG. 4, the upper metal layer segment 402 is from the AP layer. Some simulation studies have found that using the AP layer for the upper metal layer segment 402 results in improvement in coupling strength compared to using the M11 layer. It is expected that using the RDL for the upper metal layer segment 402 would result in further improved coupling strength. Middle layer segments 404 may be formed from middle metal layers of an integrated circuit such as the M7 to M11 layers. If the M11 layer is used for the upper metal layer segment 402, the middle metal layer segments 404 may be formed from the M7 to M10 layers.

In the example of FIG. 4, the bottom section of the vertically-aligned inductor 400 is formed by a plurality of lower metal layer segments 406 which correspond to lower metal layers of an integrated circuit, for example the M1, M2, M3, M4, M5 and M6 metal layers. The lower metal layer segments 406 may be stacked and electrically coupled together by vias 409, as described above, to achieve a desired thickness for the bottom section of the vertically-aligned inductor 400 and reduce series resistance.

When fabricated on a substrate such as a semiconductor device, integrated circuit, or chip, the vertically-aligned inductor 400 is aligned perpendicular to the plane of the substrate. That is, the one or more turns of the vertically-aligned inductor 400 are in a plane perpendicular to the plane of the substrate. The vertically-aligned inductor 400 may be fabricated using any suitable fabrication processes.

Properties of the vertically-aligned inductor 400, including the height, width and depth of the vertically-aligned inductor 400, the selection and number of metal layers, the size and the number of vias 408, 409 and/or the spacing between turns may be dependent on the fabrication process and the application for the vertically-aligned inductor 400. In some examples, the dimensions of the vertically-aligned inductor 400, such as the height H, may be restricted to certain values or ranges dependent on the design and fabrication of the integrated circuit. For example, where the AP layer is used for the upper metal layer segment 402, the thickness of the upper metal layer segment 402 may be dependent on the thickness of the AP layer. In the example of FIG. 4, the width of the upper metal layer segment 402 is about 1.8 µm. The widths of the middle and lower metal layer segments 404, 406 are about 3.2 µm.

For example, in single transistor 7 nm scale devices, the height of a vertically-aligned inductors 400 may be approximately 3 µm. This height may be increased by approximately 2 µm, to a total of 5 µm, by using the AP layer to form the upper metal layer segment 402.

The vertically-aligned inductor 400 may have an input port (not shown) and an output port (not shown) connected to first and second ends 410, 412. In the example of FIG. 4, the first and second ends 410, 412 may be on the same metal layer. In other examples, the first and second ends 410, 412 may be provided on different metal layers. The position of the first and second ends 410, 412 may be selected depending on implementation.

Figure 5:
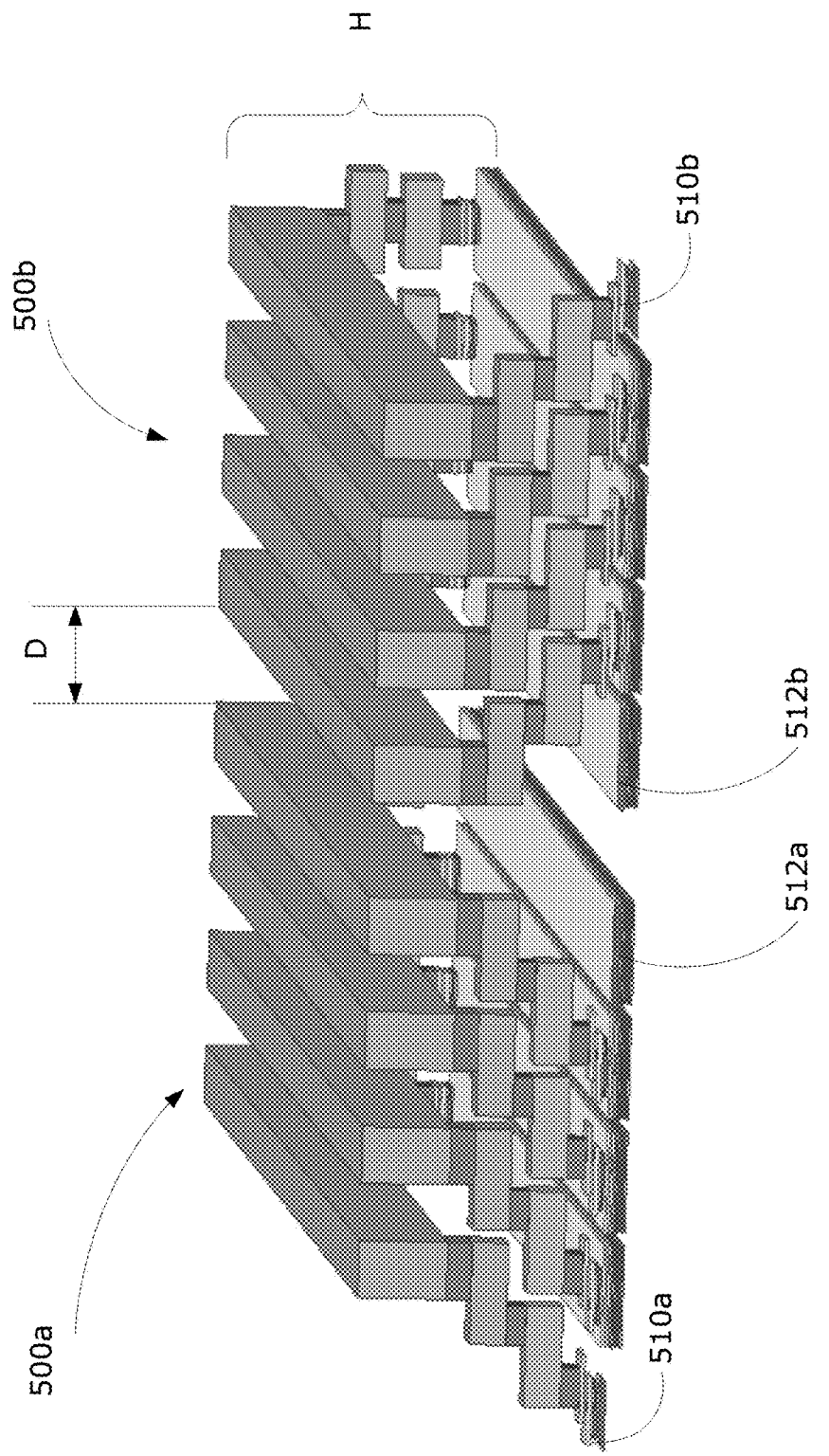
FIG. 5 is a perspective view of example multi-turn vertically-aligned inductors designed for NFC.

In FIG. 4, the metal layer segments 404 forming one side section of the vertically-aligned inductor 400 are staggered, such that they are connected in a staircase-like configuration. This configuration results in one end 410 of a single turn being laterally offset from the other end 412. This enables a multi-turn inductor to be formed by joining the ends 410, 412 of several single turns. Examples of multi-turn vertically-aligned inductors are shown in FIG. 5. FIG. 5 is a perspective view of a pair of example 4 turn vertically-aligned inductors 500a, 500b (generally referred to as multi-turn vertically-aligned inductors 500). The pair of inductors 500 are arranged for mutual coupling, and are separated by a distance D. Each multi-turn vertically-aligned inductor 500 may be provided on a respective substrate, such as respective integrated circuits (not shown), and the multi-turn vertically-aligned inductors 500 may be arranged for edge-to-edge coupling between the integrated circuits. Each multi-turn vertically-aligned inductor 500 has a first end 510a, 510b (generally referred to as first end 510) and a second end 512a, 512b (generally referred to as second end 512) for connecting to input and output ports. In this example, each turn of the multi-turn vertically-aligned inductors 500 is formed similarly to the single-turn vertically-aligned inductor 400 of FIG. 4. The pitch between turns is about 3.6 µm in the example shown in FIG. 5.

Although FIG. 5 illustrates two 4 turn vertically-aligned inductors 500, in some examples the number of turns of each inductor in a pair of coupled inductors may be different. For example, a multi-turn vertically-aligned inductor 500 may be coupled with a single-turn vertically-aligned inductor 400. As well, the number of turns in the vertically-aligned inductor may be varied by increasing or decreasing the number of single turns that are connected together. For example, the 4 turn vertically-aligned inductor 500 shown in FIG. 5 may be increased to 5 turns simply by forming an additional single turn and connecting the additional turn at one end 510, 512 of the existing 4 turns. Each turn of the multi-turn vertically-aligned inductor 500 may be substantially similar in dimensions (e.g., height, width, depth and/or overall shape) and construction.

Conventional horizontally-aligned inductors tend to be limited in the number of turns that can be formed because the horizontally-aligned inductor is formed only in one or two metal layers, with the turns formed in a spiral. Such limitations may not apply to the disclosed vertically-aligned inductors.

In FIG. 5, the multi-turn vertically-aligned inductors 500 are a distance D from each other. Distance D may be varied depending on the application. Distance D may also be optimized for coupling strength and coupling efficiency for NFC applications. In use, one the vertically-aligned inductor 500a acts as a transmitting inductor and the other inductor 500b acts as a receiving inductor. In some embodiments, the vertically-aligned inductors 500 may be designed to be capable of acting as both transmitting and receiving inductors at the same or different times. When the pair of inductors 500 is in use, magnetic flux is generated in the transmitting inductor 500a and is transmitted over distance D to the receiving inductor 500b which converts the magnetic flux into electrical current. In this way, vertically-aligned inductors 500 may be wirelessly coupled via inductive coupling, for example to enable edge-to-edge NFC between two integrated circuits.

As shown in FIG. 6, unlike integrated circuits (ICs) using conventional horizontally-aligned inductors 650, two integrated circuits each with vertically-aligned inductors 600 may be arranged such that the vertically-aligned inductors 600 face each other. That is, the entire planes of both vertically-aligned inductor 600 are available for inductive coupling. In contrast, in the conventional horizontally-aligned inductors 650, only one side of each horizontally-aligned inductor 650 is available for coupling.

In the pair of vertically-aligned inductors 600, the inductors 600 can be placed closer to the edge of the respective integrated circuits, thus reducing the distance between inductors 600. As distance between inductors affects coupling strength, coupling efficiency between vertically-aligned inductors 600 may be greater compared to conventional horizontally-aligned inductors 650. For edge-to-edge coupling between integrated circuits, the coupling distance between the vertically-aligned inductors 600 is shorter and more direct.

Though the integrated circuits are positioned the same distance apart (e.g., about 3 µm), the distance between the faces of the inductors (indicated by dotted arrow) is greater in the pair of horizontally-aligned inductors 650 compared to the pair of vertically-aligned inductors 600. Compared to the conventional coupling of horizontally-aligned inductors 650, there is improved field strength between the vertically-aligned inductors 600, which may result in improved coupling efficiency. The vertically-aligned inductor may thus enable improved edge-to-edge communication between integrated circuits.

In some examples, the vertically-aligned inductors 600 may be arranged on each integrated circuit such that the vertically-aligned inductors 600 share a common central axis, which may further increase inductive coupling between the inductors 600.

FIG. 7 compares the top views of an integrated circuit with vertically-aligned inductors 600 and an integrated circuit with conventional horizontally-aligned inductors 650. As shown in FIG. 7, the use of vertically-aligned inductors 600 may allow more inductors 600 to be placed at the edges of the integrated circuit, to enable more opportunities for edge-to-edge coupling between integrated circuits.

Further, as can be seen in FIG. 7 vertically-aligned inductors 600 may occupy a reduced area of a metal layer on an integrated circuit, compared to horizontally-aligned inductors. More area of the integrated circuit is left unaffected by the vertically-aligned inductors 600, providing more area for placement of other components such as power grids, power bumps, and circuitry. This may also be useful when coupled inductors are used as peaking inductors, for example.

Figure 8:
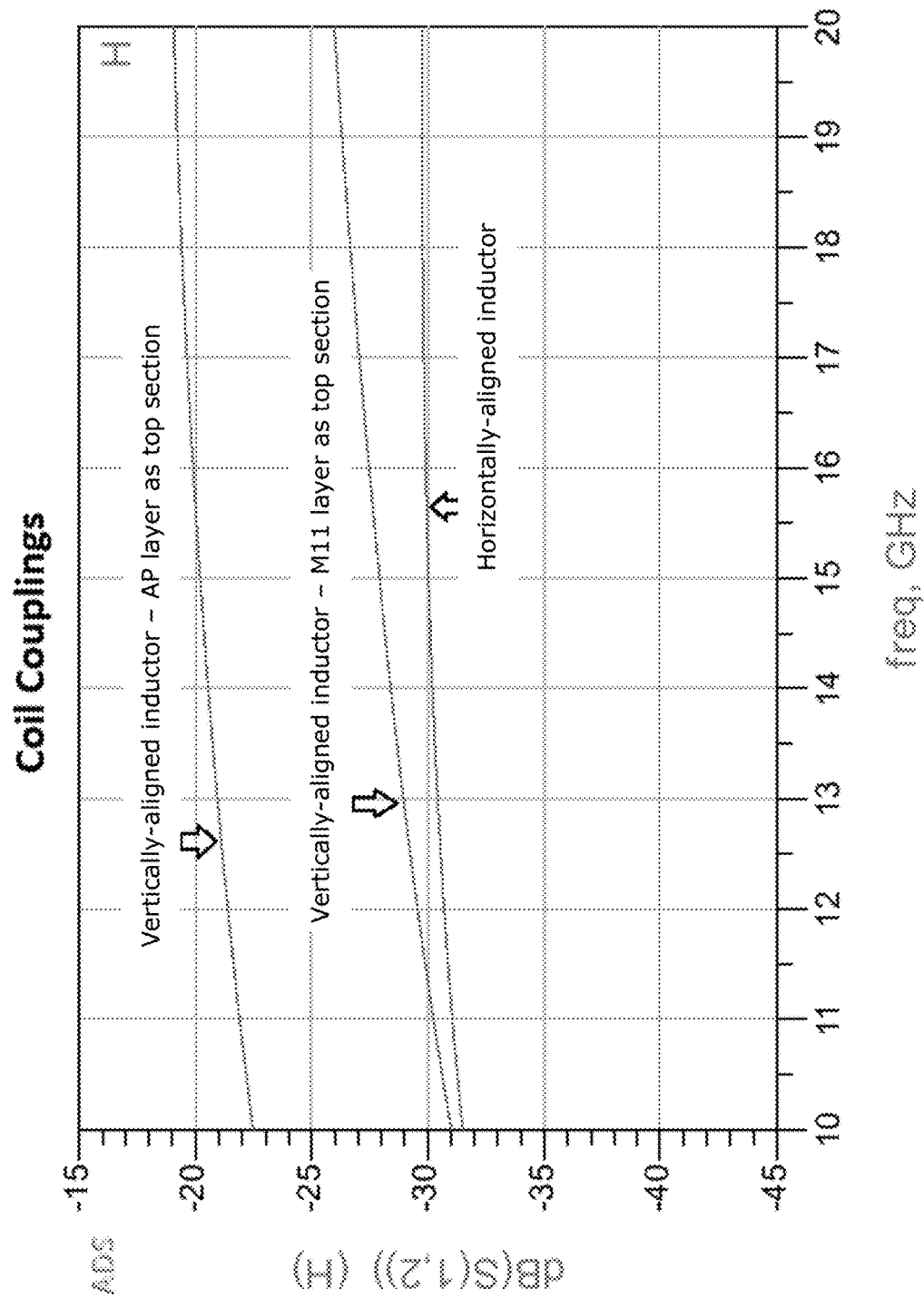
FIG. 8 is a plot of simulation results comparing coupling strength between horizontally-aligned and vertically-aligned inductors.

FIG. 8 is a plot of simulation results showing the edge-to-edge coupling strength between two integrated circuits using horizontally-aligned inductors compared to the edge-to-edge coupling strength between integrated circuits using vertically-aligned inductors. A vertically-aligned inductor using the AP layer for the top section is also compared to a vertically-aligned inductor using the M11 layer for the top section. In these simulations, the horizontally-aligned inductors and the vertically-aligned inductors were simulated at identical inductance values of about 330 picohenry (pH), with two-turn coils and the integrated circuits were separated a distance D of 3 µm. The simulations found the coupling efficiency between the vertically-aligned inductors using the AP layer for the top section to be about 10 decibels (dB) greater than the coupling efficiency between horizontally-aligned inductors. The coupling efficiency was found to be improved by about 4 dB, compared to the horizontally-aligned inductors, for the vertically-aligned inductors using the M11 layer for the top section.

In further simulations (not shown), it was found that the coupling between vertically-aligned inductors may be further increased by using vertically-aligned inductors with fewer turns and by increasing the height H of the vertically-aligned inductors. Thus, there may be a trade-off between coupling strength and inductor size. In some simulations, it was found that a vertically-aligned inductor with 2-4 turns provided strong coupling with reasonable inductor size for a given inductance. The height of a vertically-aligned inductor may be increased by using thicker metal layers and/or a greater number of metal layers to form the top, side and/or bottom sections of the vertically-aligned inductor.

Figure 9:
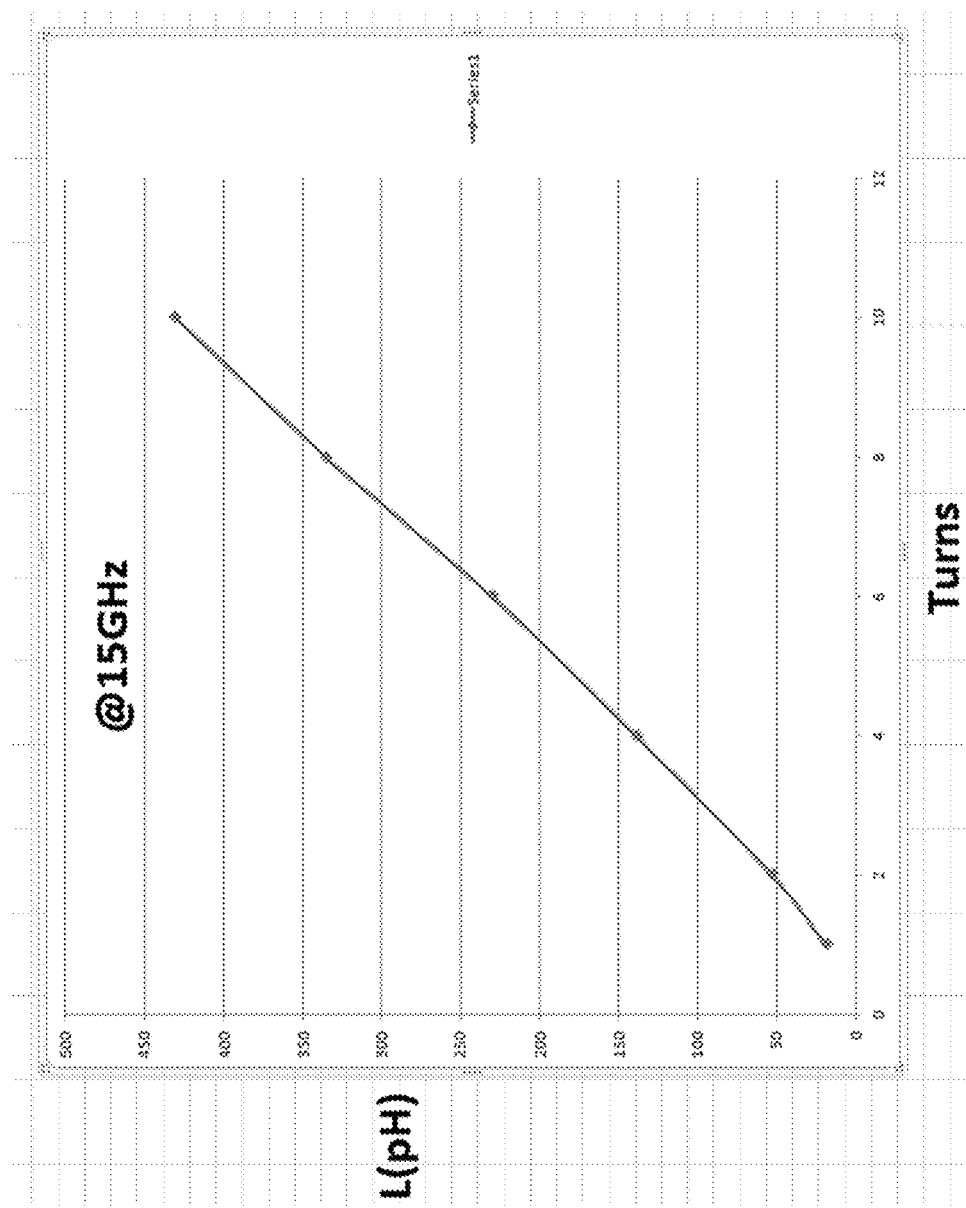
FIG. 9 is a plot of simulation results showing inductance of vertically-aligned inductors having different number of turns, in accordance with embodiments disclosed herein.

FIG. 9 is a plot of simulation results showing inductance vs. number of turns in a vertically-aligned inductor. The simulated inductors for FIG. 9 have a top section formed by the M11 layer, and a bottom section formed by the M1 to M6 layers together. The inductors in the simulations are 20 µm long with about 1 µm segment width for metal layers M1-M6 and M11.

The inductance of a multi-turn inductor may be calculated using the formula:

$$L \sim 2.5*(N-1)*L_0,$$

where $L_0$ is the inductance for a single turn inductor, and N is the number of turns (N>1). Other vertically-aligned inductors having different configurations (e.g., using different metal layers) may have a different formula due to a different pitch between turns.

As the number of turns is increased, the inductance subsequently increases. A larger number of turns may be preferable in applications where higher inductance rather than increased coupling efficiency is desired.

Increased coupling efficiency may lead to improved performance in NFC applications. Compared to conventional horizontally-aligned inductors, the improved coupling of the vertically-aligned inductors disclosed herein may enable the inductors to exhibit features similar to differential inductors. Differential inductors possess comparable inductance values as other inductors but occupy a reduced area. Differential inductors also have increased Quality (Q) factors for differential excitation, and possess improved common-mode rejection ratios. For some applications, an increased Q factor is an important consideration. Coupling between peaking inductors may be further increased by optimizing the placement of the inductors in such circuits.

Figure 10:
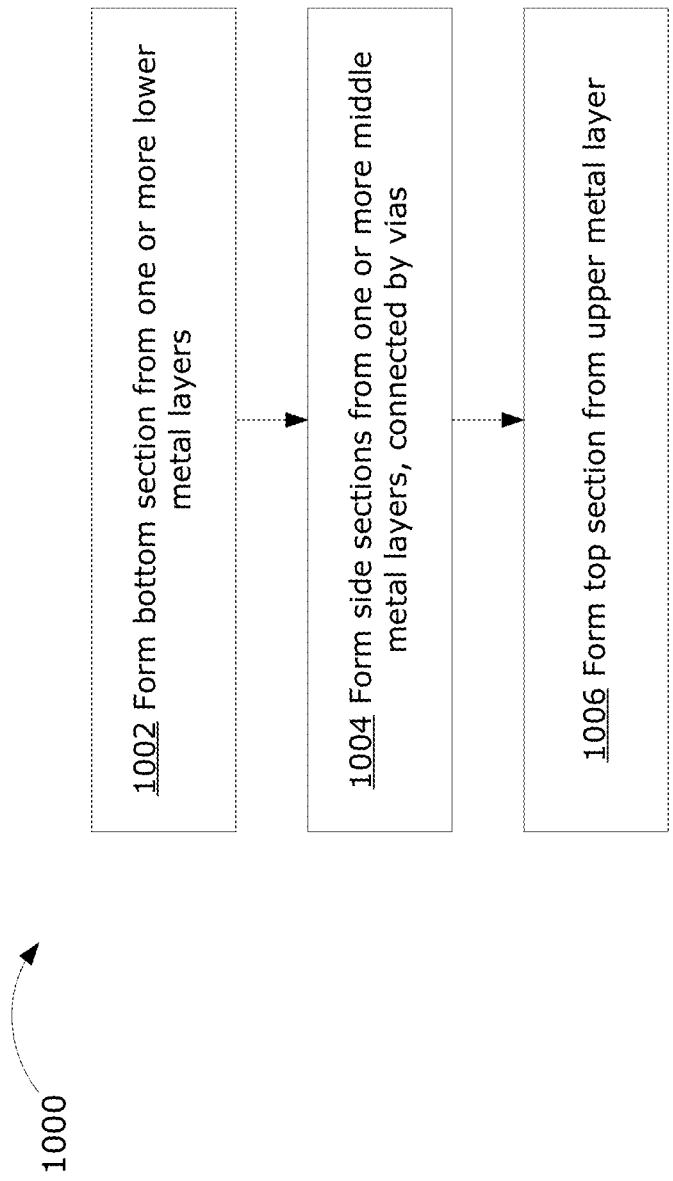
FIG. 10 is a flowchart illustrating an example method for fabricating examples of the vertically-aligned inductors disclosed herein.

FIG. 10 is a flowchart illustrating an example method 1000 for fabricating a vertically-aligned inductor, for example as shown in FIGS. 4 and 5, where the substrate is an integrated circuit. Generally, the circuits disclosed herein may be manufactured using any suitable chip manufacturing process, for example according to the Taiwan Semiconductor Manufacture Company (TSMC) N16FF+ process, or any other process applicable for chips including for 7 nm, 16 nm, 28 nm and 65 nm technologies.

The following example method 1000 is described as an example only and is not intended to be limiting or exhaustive.

In accordance with the example method 1000, one or more vertically-aligned inductors are fabricated and disposed on a substrate. The substrate may be an integrated circuit or other suitable substrate. The vertically-aligned inductor may be disposed at or near the edge of the integrated circuit, or other desired location.

At 1002, a bottom section of the vertically-aligned inductor is formed from one or more lower metal layers during fabrication of the integrated circuit. The metal layer(s) may be deposited using chemical vapour deposition, physical vapour deposition or other suitable deposition techniques. The metal layer is subsequently patterned and etched using suitable patterning and etching techniques, to form the bottom section from segment(s) of the lower metal layer(s). Where multiple lower metal layers are used for the bottom section, the lower metal layers may be electrically coupled (e.g., using vias).

At 1004, side sections of the vertically-aligned inductor are formed from one or more middle metal layers during fabrication of the integrated circuit, for example using similar techniques as in step 1002. Vias may be used to electrically couple the middle metal layer segments to each other and to the bottom section formed at 1002.

At 1006, a top section of the vertically-aligned inductor is formed from an upper metal layer during fabrication of the integrated circuit, for example using similar techniques as in step 1002. Vias may be used to electrically couple the top section to the side sections formed at 1004.

The vertically-aligned inductor may be designed to enable edge-to-edge inductive coupling or other near field coupling between two integrated circuits as described previously. The two integrated circuits may be located on the same or different substrate, for example within the same package.

Although certain dimensions and configurations have been described, these are provided as examples only and are not intended to be limiting. Dimensions and configurations may be varied as appropriate, for different applications.

Examples disclosed herein may be suitable for use in NFC technology, for use in system-in-package (SiP) IC applications (including 2D, 2.5D or 3D ICs), system-on-a-chip (SoC) applications, system-on-package (SoP) applications and multi-chip module (MCM) applications, as well as in various network, storage, computing and mobile systems, including those which require high speed and power efficient coupling between inductors.

Examples disclosed herein may also be suitable for use in circuits with integrated inductors which are normally implemented in the horizontal plane of the circuit.

Examples disclosed herein may also be suitable for use as shunt peaking inductors.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A device comprising:
    at least one inductor positioned on a substrate, the substrate having at least one major surface defining a horizontal plane, the at least one inductor having a plurality of turns about a horizontal axis parallel to the horizontal plane, the at least one inductor being positioned for near field coupling with another inductor, wherein:
    a first turn of the plurality of turns comprises a plurality of segments positioned in a plurality of metal layers of the substrate, each segment being electrically connected to a subsequent segment by a via, a first such segment being a first end segment and a last such segment being a second end segment;
    at least two of the plurality of segments being displaced along the horizontal axis relative to a prior segment such that a projection of the first end segment onto the horizontal axis does not overlap with a projection of the second end segment onto the horizontal axis; and
    a second turn of the plurality of turns has a first end segment connected to the second end segment of the first turn.

2. The device of claim 1 wherein the at least one inductor is positioned at or near an edge of the substrate.

3. The device of claim 1 wherein the at least one inductor is one of a series peaking inductor, a shunt peaking inductor, or a T-coil.

4. The device of claim 1 wherein the substrate comprises an integrated circuit.

5. The device of claim 4 wherein:
    the plurality of metal layers of the substrate comprise an upper metal layer, one or more middle metal layers, and one or more lower metal layers of the integrated circuit;
    a top section of the at least one inductor comprises one of the plurality of segments positioned in the upper metal layer of the integrated circuit;
    side sections of the at least one inductor comprise two or more of the plurality of segments positioned in the one or more middle metal layers of the integrated circuit; and
    a bottom section of the at least one inductor comprises one or more of the plurality of segments positioned in the one or more lower metal layers of the integrated circuit; and
    the respective segments are electrically coupled through vias to form at least one turn of the at least one inductor.

6. The device of claim 5 wherein the upper metal layer is a redistribution design layer (RDL) of the integrated circuit.

7. The device of claim 6 wherein the upper metal layer is an aluminum for bond pad (AP) layer of the integrated circuit.

8. The device of claim 4 wherein the turns of the at least one inductor are similar to each other in dimensions.

9. A device comprising:
    a first inductor positioned on a first substrate, the first substrate having at least one major surface defining a first horizontal plane, the first inductor having a plurality of turns about a first horizontal axis parallel to the first horizontal plane; and
    a second inductor positioned on a second substrate, the second substrate having at least one major surface defining a second horizontal plane, the second inductor having at least one turn about a second horizontal axis parallel to the second horizontal plane, the first and second horizontal planes being substantially parallel to each other;
    wherein the first and second inductors are designed to be inductively coupled to each other;
    a first turn of the plurality of turns of the first inductor comprises a plurality of segments positioned in a plurality of metal layers of the first substrate, each segment being electrically connected to a subsequent segment by a via, a first such segment being a first end segment and a last such segment being a second end segment;
    at least two of the plurality of segments being displaced along the first horizontal axis relative to a prior segment such that a projection of the first end segment onto the first horizontal axis does not overlap with a projection of the second end segment onto the first horizontal axis; and
    a second turn of the plurality of turns of the first inductor has a first end segment connected to the second end segment of the first turn.

10. The device of claim 9 wherein at least one of the inductors is one of a series peaking inductor, a shunt peaking inductor, or a T-coil.

11. The device of claim 9 wherein the first substrate comprises an integrated circuit.

12. The device of claim 11 wherein:
the plurality of metal layers of the first substrate comprise an upper metal layer, one or more middle metal layers, and one or more lower metal layers of the integrated circuit;
a top section of the first inductor comprises one of the plurality of segments positioned in the upper metal layer of the integrated circuit;
side sections of the first inductor comprise two or more of the plurality of segments positioned in the one or more middle metal layers of the integrated circuit; and
a bottom section of the first inductor comprises one or more of the plurality of segments positioned in the one or more lower metal layers of the integrated circuit; and
the respective segments are electrically coupled through vias to form at least one turn of the first inductor.

13. The device of claim 12 wherein the upper metal layer is a redistribution design layer (RDL) of the integrated circuit.

14. The device of claim 12 wherein the upper metal layer is an Aluminum for bond pad (AP) layer of the integrated circuit.

15. The device of claim 9 wherein the first and second substrates are positioned edge-to-edge.

16. The device of claim 9 wherein the first and second inductors are used for near field communication in a system-in-package, a system-on-a-chip, a system-on-package or a multi-chip module.

\* \* \* \* \*